United States Patent
Gray et al.

(10) Patent No.: US 11,768,978 B1
(45) Date of Patent: Sep. 26, 2023

(54) SYSTEMS AND METHODS FOR CONTEXTUAL OCCUPANCY SIMULATION

(71) Applicant: United Services Automobile Association (USAA), San Antonio, TX (US)

(72) Inventors: Emily Margaret Gray, San Antonio, TX (US); Daniel Christopher Bitsis, Jr., San Antonio, TX (US); Qunying Kou, Fair Oaks Ranch, TX (US); Robert Wiseman Simpson, Fair Oaks Ranch, TX (US); Manfred Amann, San Antonio, TX (US); Donnette Moncrief Brown, San Antonio, TX (US); Eric David Schroeder, San Antonio, TX (US); Meredith Beveridge Lecocke, San Antonio, TX (US); Michael J. Maciolek, Boerne, TX (US); Bobby Lawrence Mohs, San Antonio, TX (US); Brian F Shipley, Plano, TX (US); Justin Dax Haslam, San Antonio, TX (US); Ashley Raine Philbrick, San Antonio, TX (US)

(73) Assignee: United Services Automobile Association (USAA), San Antonio, TX (US)

( * ) Notice: Subject to any disclaimer, the term of this patent is extended or adjusted under 35 U.S.C. 154(b) by 106 days.

(21) Appl. No.: 16/899,280

(22) Filed: Jun. 11, 2020

Related U.S. Application Data

(60) Provisional application No. 62/860,633, filed on Jun. 12, 2019.

(51) Int. Cl.
*G06F 30/20* (2020.01)
*G08B 15/00* (2006.01)

(52) U.S. Cl.
CPC .......... *G06F 30/20* (2020.01); *G08B 15/002* (2013.01)

(58) Field of Classification Search
CPC ....... G08B 15/002; G06F 30/20; G06F 30/25; G06F 30/27; G06F 30/28; G06F 2111/00–2119/22
See application file for complete search history.

(56) References Cited

U.S. PATENT DOCUMENTS

| | | | | |
|---|---|---|---|---|
| 4,970,489 | A * | 11/1990 | Jenkins | G08B 15/002 340/309.8 |
| 5,786,760 | A * | 7/1998 | Suzuki | G08B 15/002 340/384.3 |
| 10,755,537 | B1 * | 8/2020 | Palmer | H04N 7/185 |
| 10,777,057 | B1 * | 9/2020 | Siminoff | H04R 27/00 |
| 2016/0261425 | A1 * | 9/2016 | Horton | H04L 12/282 |
| 2017/0116483 | A1 * | 4/2017 | Richardson | G06F 3/017 |
| 2018/0330589 | A1 * | 11/2018 | Horling | G05B 15/02 |
| 2018/0350219 | A1 * | 12/2018 | Correnti | G08B 25/08 |
| 2019/0088099 | A1 * | 3/2019 | Garg | G06F 3/165 |
| 2020/0372775 | A1 * | 11/2020 | Nguyen | G08B 3/10 |
| 2021/0390779 | A1 * | 12/2021 | Soryal | H04W 4/029 |
| 2021/0406528 | A1 * | 12/2021 | Ramani | G06V 40/28 |

* cited by examiner

*Primary Examiner* — Rehana Perveen
*Assistant Examiner* — Troy A Maust
(74) *Attorney, Agent, or Firm* — Fletcher Yoder, P.C.

(57) ABSTRACT

Systems and method for realistic simulation of occupancy are provided herein. A context associated with one or more smart devices associated with a property is reterieved, Then, simulation content specific to the context is requested. The simulation content is then caused to be presented by the one or more smart devices.

19 Claims, 4 Drawing Sheets

SYSTEMS AND METHODS FOR CONTEXTUAL OCCUPANCY SIMULATION

CROSS-REFERENCES TO RELATED APPLICATIONS

The present disclosure is related to, and claims priority to, U.S. Provisional Patent Application Ser. No. 62/860,633, titled "Systems and Methods for Contextual Occupancy Simulation," which was filed on Jun. 12, 2019, which is herein incorporated by reference in its entirety for all purposes.

BACKGROUND

The present disclosure relates generally to contextualized occupancy simulation performed inside and/or outside a property. More specifically, the present disclosure relates to using distributed smart devices to simulate occupancy inside or outside the property.

Property occupancy has traditionally been utilized as a means for deterring bad acts, such as home invasion. For example, simple audio devices have presented fake dog barks, etc. upon detecting motion or sound (e.g., a door knock). Unfortunately, these occupancy simulations are oftentimes simplistic and unrealistic, causing the simulation to be easily detected by bad actors. Accordingly, new, more sophisticated simulators may be desirable.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to a system that provides a contextual based occupancy simulation using smart devices distributed inside and/or outside the property. Contextual information of the smart devices are used to select an appropriate simulation based upon the contextual information. For example, simulation content (e.g., audio or video content) may be selected for presentation via a smart device. The simulation content may be tailored for a particular location of the smart device. Thus, a dog eating food or drinking water may be presented in a location where a dog would typically eat food or drink water (e.g., a kitchen), while a dog sleeping may be presented on smart devices in a location where a dog might typically sleep (e.g., a laundry room). The simulation content may be coordinated, such that simulation content is only played in times and locations feasible with traditional movements of the object being simulated. For example, a dog cannot be in two places at once and cannot move 100 yards in 5 seconds. Accordingly, in some embodiments, simulation content coordination between two locations will not play content at the same time or within 5 seconds (for a 100 yard distance), unless multiple objects are being simulated (e.g., multiple dogs).

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As discussed above, occupancy simulation in and/or around a property may be useful to deter bad actions, such as home invasion, robbery, etc. around a property. Traditional occupancy simulators have been less than realistic, oftentimes relying on static content that does not change based upon location of the simulation. The present disclosure is directed to a contextual-based approach to simulating occupancy, such that a more realistic simulation that is more-likely to deter bad actions is provided.

Figure 1:
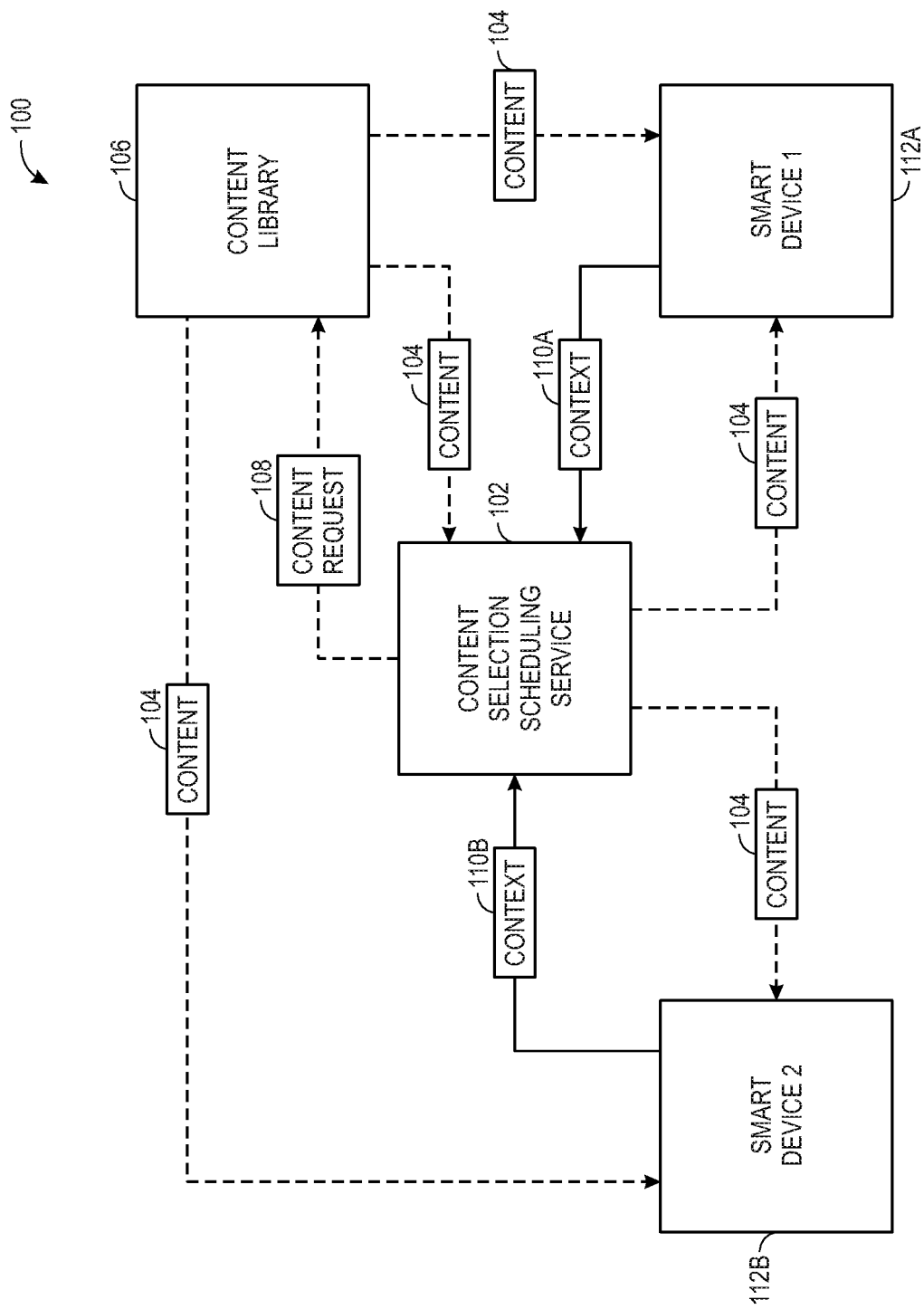
FIG. 1 illustrates a block diagram of a system for providing contextual-based occupancy simulation, in accordance with embodiments described herein.

By way of introduction, FIG. 1 illustrates a block diagram of a system 100 for providing contextual-based occupancy simulation, in accordance with embodiments described herein. As illustrated, the system 100 includes a content selection and scheduling service 102, which selects simulation content and simulation content schedules for performance of selected simulation content 104. The simulation content 104 is retrieved from a content library 106, based upon a content request 108 provided from the content selection and scheduling service 102.

The content scheduling and selection service 102 may determine the content to request by receiving a context 110 from smart devices 112 associated with the property. For example, here, a context 110A associated with smart device 112A and a context 110B associated with smart device 112B are provided to the content selection and scheduling service. The context 110 may provide specific contextual details regarding the smart devices 112. For example, the context 110 may provide an indication of location relative to the property that the smart device 112 is in (e.g., this smart device 112A is in the kitchen) and/or may provide contextual information with regard to other smart devices 112 (e.g., smart device 112A is 100 yards from smart device 112B).

The context 110 of these smart devices 112 may be used to determine particular simulation content to present at the smart devices 112 and/or a schedule of when the present the simulation content at the smart devices 112. For example, when simulating occupancy of an animal, such as a dog, the distance between smart devices 112A and 112B may be used to determine a simulation playback delay between these devices. If, for instance, a typical dog walks at a pace of 1.5 miles per hour, this speed can account for a delay between playback of simulation content between the distance of smart devices 112A and 112B. In other words, a rate of travel between smart devices 112A and 112B may be simulated using a delay in presentation of simulation content, based upon the distance between smart devices 112A and 112B along with the average rate of travel of the simulated object.

Further, the location of the smart devices 112 may be used to determine which simulation content to select and present. For example, if the smart device 112A is in the kitchen, a dog eating or drinking simulation content may be presented, as these are typical activities of dogs in the kitchen. If the smart device 112A is in a foyer, the simulation content could simulate a dog scratching the front door, as this may be a typical activity for a dog in a foyer. By providing contextual-based occupancy simulation, occupancy simulation may become more realistic and a better deterrent against bad actions in or around a property.

In some embodiments, the simulation content 104 may be provided directly from the content library 106 to the smart devices 112. In other embodiments, the content selection and scheduling service 102 may act as an intermediary that receives the simulation content 104 from the content library 106 and provides the simulation content 104 to the smart devices 112 for playback. The content selection and scheduling service 102 may cause indication of the scheduling to be included with the supplied simulation content 104 and/or may provide the simulation content 104 at the time is should be presented by the smart device 112.

Figure 2:
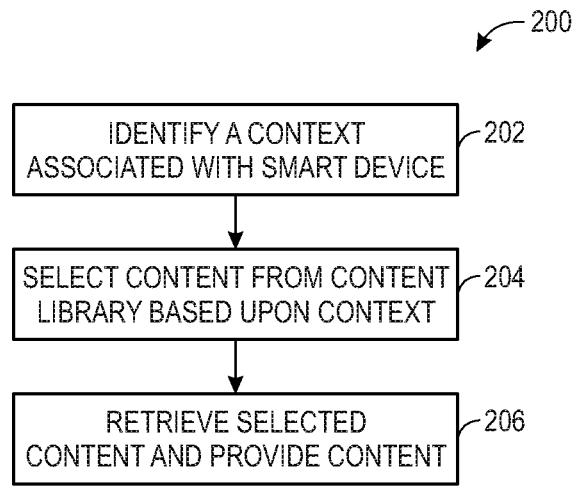
FIG. 2 illustrates a flowchart of a process for contextual-based occupancy simulation, in accordance with embodiments described herein.

FIG. 2 illustrates a flowchart of a process 200 for contextual-based occupancy simulation, in accordance with embodiments described herein. The process 200 begins with identifying a context associated with smart device(s) associated with a property (block 202). As mentioned above, the context may include, among other things, a location of the smart device (e.g., a foyer, a kitchen, a bedroom, etc.). In some instances, the context may include a distance between the smart device and other smart devices associated with the property.

The context of the smart devices may be derived from a number of sources. In one instance, the smart device location may be derived from an app that maintains data about the smart devices. For example, for Amazon Alexa-enabled devices, the Alexa app may be used to obtain the smart device's location. In some instances, an application programming interface (API) of the Alexa service may provide the context of such smart devices to the content selection and scheduling service. In some instances, the name associated with the smart device may be useful to discern the context. For example, "Kitchen Speaker" may indicate that the location is a kitchen. In some cases, a user input may be used to indicate a location or a distance between smart devices.

In some embodiments, tones may be used to identify distances between smart devices. For example, a tone may be sent from a first smart device at a particular intensity level (e.g. decibel (dB)). Another smart device may have a microphone that picks up the tone. The intensity of the picked up tone can be compared with the sent intensity to make a determination as to a distance between the sending and receiving smart devices. For example, if the sent intensity and received intensity are similar, this may indicate that the smart devices are closer to each other than when the sent intensity is much larger than the received intensity.

Next, the simulation content is selected from a content library based upon the context (block 204). For example, as explained above, room specific content may be provided. For example, kitchen based simulation content may be selected for a kitchen speaker.

The content is retrieved and provided for playback by the smart device (block 206). For example, as mentioned above, the selected simulation content may be provided directly from the content library to the smart device or may be retrieved from the content library by the content selection and scheduling service and provided back to the smart device for playback from the content selection and scheduling service.

As mentioned above, a particular playback time may be desirable. The content selection and scheduling service may determine the playback time and cause the content library or the content selection and scheduling service itself to provide the simulation content at the desired scheduled time to enable instant playback at the desired scheduled time or provide the simulation content with a desired scheduled playback time, enabling the smart device to delay playback of the simulation content until the desired scheduled playback time.

When discussing provision of the content to the smart devices, it is important to note that in some embodiments, provision of the simulation content may merely be provision of a command to retrieve the simulation content from a cloud content library and playback the simulation content at the desired scheduled time. In other words, in contrast to embodiments where provision of simulation content means actually pushing the simulation content to the smart device, certain embodiments merely receive a command to retrieve and playback the simulation content.

Figure 3:
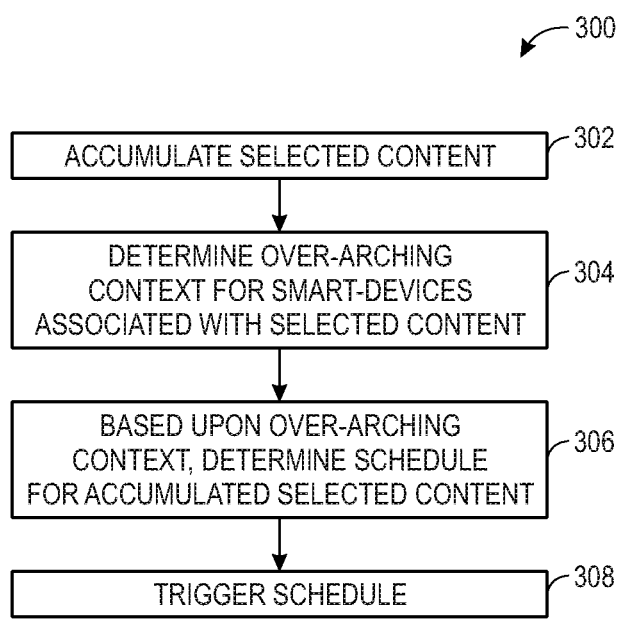
FIG. 3 illustrates a flowchart of a process for coordinated contextual-based occupancy simulation, in accordance with embodiments described herein.

Turning now to a discussion of simulation scheduling, FIG. 3 illustrates a flowchart of a process 300 for coordinated contextual-based occupancy simulation, in accordance with embodiments described herein. The process 300 begins by accumulating selected simulation content that is applicable to the locations where the smart devices are located (block 302). For example, if there are smart speakers in the kitchen, living room, and bedroom of a house, simulation content applicable to those locations is selected.

Next, an over-arching context for the smart devices associated with selected content is determined (block 304). For example, distances between smart devices may be derived, relationships between locations where the smart devices are found may be derived, etc. One example relationship might be that at night a human typically takes a shower before bed. Accordingly, there is a relationship between a smart device in a bathroom and a smart device in a bedroom. Another example relationship may be that a human typically eats breakfast upon waking up in the morning. Accordingly, there is a relationship between a smart device in the bedroom and a smart device in a kitchen.

Using the over-arching context of the smart devices, a schedule may be determined for the accumulated selected content (block 306). For example, based upon a simulation routine of a human waking up, going to the bathroom, and then eating breakfast, the schedule may entail turning on simulation content at smart devices at wake time (e.g., 7:00 AM), starting first with simulation content in the bedroom that simulates waking up (e.g., sounds of yawning), followed by simulation content in a bathroom related to simulating going to the bathroom (e.g., sounds of teeth brushing), and finally turning on content in the kitchen that simulates eating breakfast (e.g., crunching cereal). Further, a presentation delay may be scheduled between presentation of these simulation content. The presentation delay may be based at least in part upon a simulated movement rate between the distances of the smart devices for the object being simulated (here a human).

The schedule, once created, may be triggered at an appropriate time (block 308). For example, if a wake time is typically 7:00 AM, the schedule may start at 7:00 AM.

Figure 4:
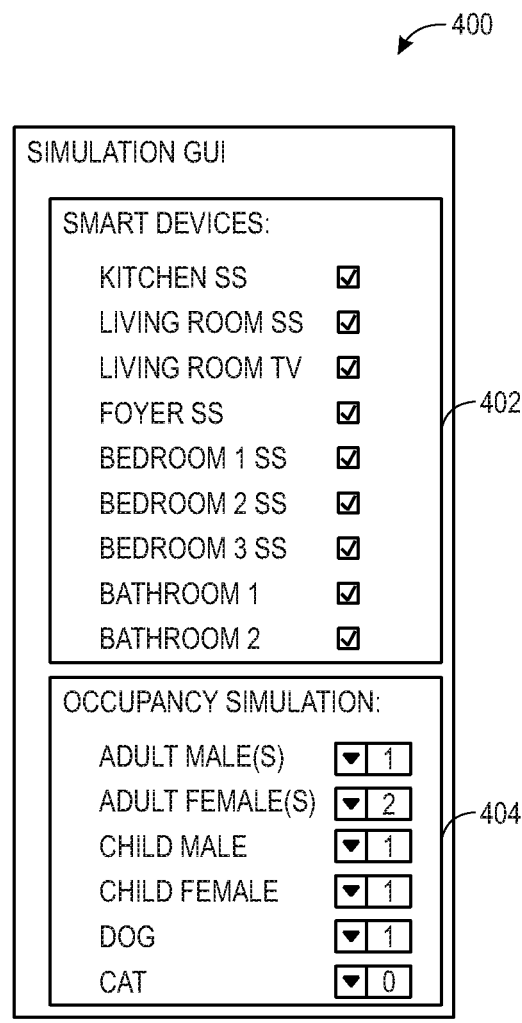
FIG. 4 illustrates a schematic diagram of a simulation graphical user interface (GUI) for controlling contextual-based simulation parameters, in accordance with embodiments described herein.

Having discussed the scheduling of coordinated playback of simulation content, the discussion now turns to controlling simulation factors. FIG. 4 illustrates a schematic diagram of a simulation graphical user interface (GUI) 400 for controlling contextual-based simulation parameters, in accordance with embodiments described herein.

The simulation GUI 400 helps facilitate simulation by providing a quick and easy view to modify parameters of the simulation. For example, in the current embodiment, the simulation GUI 400 includes a smart devices section 402 that enables a user to identify particular smart devices that can be involved in the simulation. The list of smart devices in this smart devices section 402 may be generated from a discovery process that polls available communications channels (e.g. Wi-Fi, Bluetooth, etc.) for a response from smart devices. The smart devices may provide a list of capabilities or smart device type that may be used to understand the capabilities of the smart device. From there, the smart devices are filtered down to only contain those that could be used in a simulation (e.g., ones that present audio, video, lighting, etc.). By default, all filtered smart devices may be selected for use for simulation. However, if desired, the user may de-select one or more of the selected smart devices, indicating that the un-selected smart device should not be used in the simulation.

The simulation GUI 400 also includes an Occupancy Simulation section 404 that enables the user to select the types of occupants to simulate and a number of occupants of each type to simulate. For example, in the current embodiment, 1 male adult, 2 female adults, 1 male child, 1 female child, and 1 dog are to be simulated. As mentioned above, the simulation content may be selected and scheduled for playback based upon the occupants and occupant quantity selected.

The options provided in the current simulation GUI 400 are not meant to be an exhaustive list of features, but merely a sampling of particular features that could be provided for selection by a user. In other embodiments, additional features could be provided. For example, the user could be able to select particular schedules for particular activities that should be simulated, such as beginning a bedtime routine at 10:00 PM.

Figure 5:
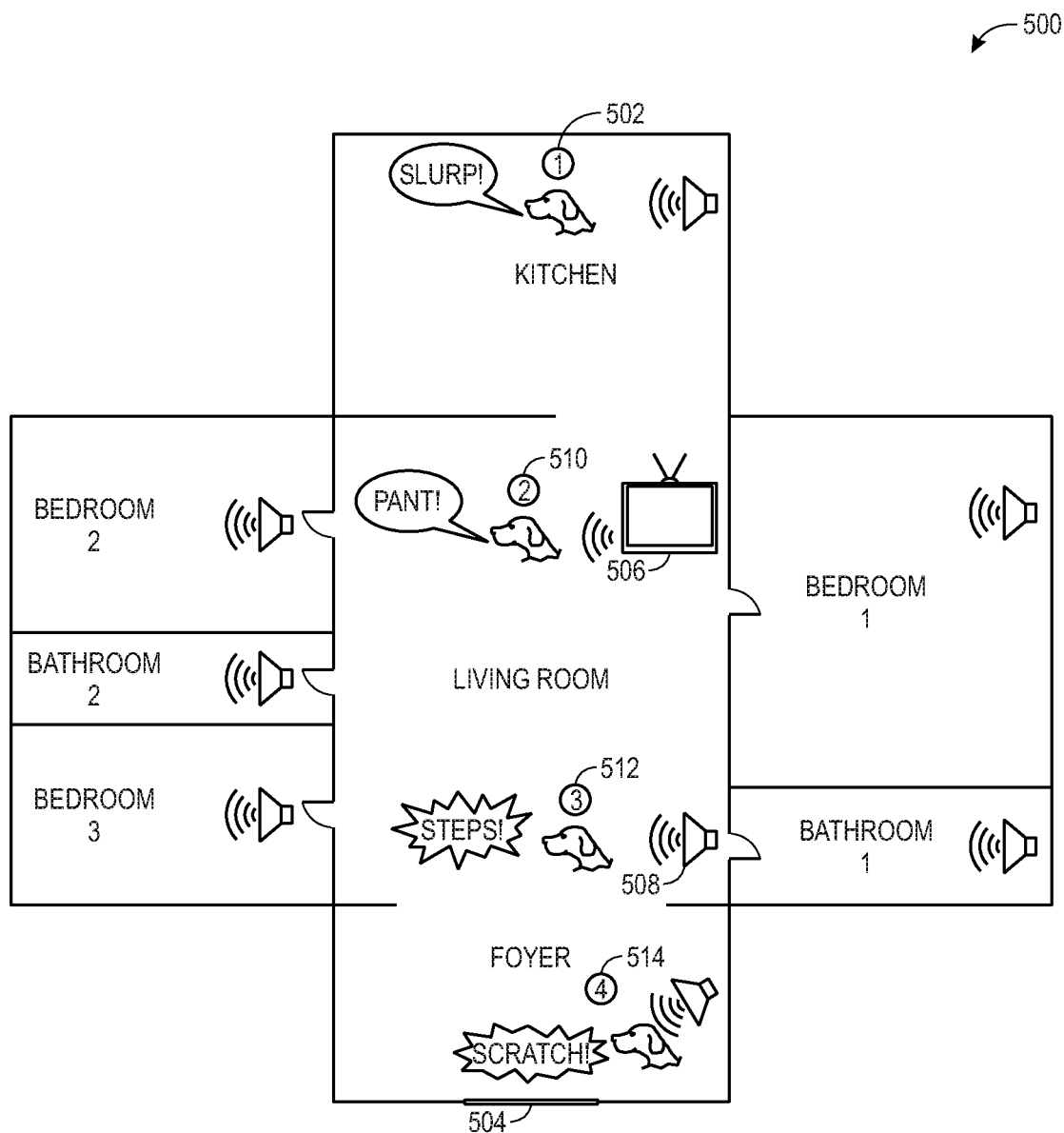
FIG. 5 illustrates a schematic diagram of a property that has implemented a coordinated contextual-based occupancy simulation, in accordance with embodiments described herein.

FIG. 5 illustrates a schematic diagram of a property 500 that has implemented a coordinated contextual-based occupancy simulation, in accordance with embodiments described herein. The coordinated contextual-based occupancy simulation in the current embodiment pertains to a simulation of a dog routine. In a first simulation step 502, a dog slurping sound is presented by a smart speaker in the kitchen, which simulates a dog drinking water in the kitchen. As may be appreciated, the context of the smart speaker being in the kitchen may be used to identify particular simulation content for the smart speaker based upon the location of the smart speaker. As mentioned above, it may be more likely that a dog bowl is found in the kitchen than elsewhere. Accordingly, dog bowl related simulation content (e.g., slurping from a dog bowl) may be targeted towards the kitchen-placed smart devices.

It may be desirable to simulate a dog proximate to an entry 504 of the property 500. For example, motion sensors or other devices may detect activity, such as a person moving, near the entry 504. To transition from the kitchen slurping simulation to a simulation of the dog proximate to the entry 504, transitional simulations may be implemented between the target simulation (e.g., a simulation near the entry 504) and the current simulation (e.g., the simulation step 502). To perform the transitional simulations, smart devices that have been selected as usable for simulation and that are spatially between smart devices used for the target simulation and the current simulation are identified. Here, smart television 506 and smart speaker 508 are identified as spatially between the smart devices used for the target simulation and the current simulation.

Next, one or more of the identified smart devices is selected for presentation of a transition simulation. Here, for example, the smart television 506 is selected to present a simulation 510 of a dog panting, as if the dog were running towards the entry 504. Further, a smart speaker 508 presents a simulation 512 of dog steps toward the entry 504. Variations in presentation may be performed in the simulation. For example, volume/intensity changes and/or directional changes (for Omni-directional speakers) may be presented to simulate spatial transition.

As mentioned above, the simulations may be impacted by characteristics of the object being simulated. For example, humans, big dogs, and small dogs may all have different rates of movement. Further, their weight differences may result in different intensities for step sounds. The rate of simulation content playback and/or the intensity of playback may be altered to account for the differences in characteristics.

Once the transitional simulations are complete, the target simulation may be implemented. Here, a simulation 514 of a dog scratching a door near the entry 504 is provided. This simulation 514 may deter bad actors that may be present at the entry 504.

As discussed herein, the present disclosure relates to contextual-based occupancy simulation. In this manner, more realistic occupancy simulation may occur over traditional occupancy simulation systems. This may result in increased deterrence of bad actions in and/or around the property.

While only certain features of disclosed embodiments have been illustrated and described herein, many modifications and changes will occur to those skilled in the art. It is, therefore, to be understood that the appended claims are intended to cover all such modifications and changes as fall within the true spirit of the present disclosure.

The invention claimed is:

1. A tangible, non-transitory, machine-readable medium, comprising machine-readable instructions that, when executed by one or more processors of the machine, cause the machine to:
    identify a first context associated with a first smart device associated with a property and a second context associated with a second smart device associated with the property, the first context comprising a first location of the first smart device and the second context comprising a second location of the second smart device;
    request first simulation content and second simulation content that simulate occupancy of an object at the first and the second locations, respectively;
    identify an occupancy time comprising a time an activity that is represented by the first simulation content is performed by an occupant of the property; and
    cause implementation of a simulation that simulates occupancy of the property, by:
        causing the first simulation content to be presented by the first smart device at the occupancy time;
        causing the second simulation content to be presented by the second smart device at a delayed occupancy time, wherein the delayed occupancy time is based on a distance between the first location and the second location and a pre-defined simulated rate of movement of the object; and
        coordinating scheduling of presentation of the first and the second simulation contents based upon an average weight of the object being simulated.

2. The machine-readable medium of claim 1, comprising machine-readable instructions that, when executed by the one or more processors of the machine, cause the machine to:
    receive the first and second simulation contents from a content library;
    provide the received first simulation content to the first smart device for presentation by the first smart device; and
    provide the received second simulation content to the second smart device for presentation by the second smart device.

3. The machine-readable medium of claim 2, comprising machine-readable instructions that, when executed by the one or more processors of the machine, cause the machine to:
    trigger presentation by the first and the second smart devices by providing the received first and second simulation contents to the first and the second smart devices, respectively.

4. The machine-readable medium of claim 1, comprising machine-readable instructions that, when executed by the one or more processors of the machine, cause the machine to:
    cause the first and the second simulation contents to be presented by the first and the second smart devices, respectively, by causing a content library to send the first simulation content to the first smart device and the second simulation content to the second smart device.

5. The machine-readable medium of claim 1, comprising machine-readable instructions that, when executed by the one or more processors of the machine, cause the machine to:
    cause the first and the second simulation contents to be presented by the first and the second smart devices, respectively, by causing a content library to send a first command to the first smart device and a second command to the second smart device requesting that the first and the second simulation contents be presented.

6. The machine-readable medium of claim 1, comprising machine-readable instructions that, when executed by the one or more processors of the machine, cause the machine to:
    cause the first and the second simulation contents to be presented by the first and the second smart devices, respectively, by sending a first command to the first smart device and a second command to the second smart device requesting that the first and the second simulation contents be presented.

7. The machine-readable medium of claim 1, wherein the first context is identified by receiving names associated with the first smart device and parsing the locations from the names, retrieving the locations from an API of the first smart device, or determining the locations based on one or more observed tones sent from the first smart device.

8. The machine-readable medium of claim 1, wherein the first context comprises a distance or location relative to the second smart device.

9. The machine-readable medium of claim 1, comprising machine-readable instructions that, when executed by the one or more processors of the machine, cause the machine to:
    coordinate scheduling of presentation of the simulation based upon one or more characteristics of the object being simulated.

10. The machine-readable medium of claim 9, wherein the one or more characteristics comprise an average rate of movement for the object, the average weight of the object, or both.

11. The machine-readable medium of claim 1, wherein the second simulation content is based on an observation, the second simulation content comprising a simulation proximate to the observation.

12. The machine-readable medium of claim 11, comprising machine-readable instructions that, when executed by the one or more processors of the machine, cause the machine to:
    generate one or more transition simulations between the first simulation content and the second simulation content, by:
        identifying a transition smart device spatially between the first smart device and the second smart device;

request transitional simulation content for the transition smart device; and
cause the transitional simulation content to be presented prior to the second simulation content.

13. A method, comprising:
identifying a first context associated with a first smart device associated with a property and a second context associated with a second smart device associated with the property, the first context comprising a first location of the first smart device and the second context comprising a second location of the second smart device;
requesting first simulation content and second simulation content that simulate occupancy of an object at the first and the second locations, respectively;
identifying an occupancy time comprising a time an activity that is represented by the first simulation content is performed by an occupant of the property; and
causing implementation of a simulation that simulates occupancy of the property, by:
 causing the first simulation content to be presented by the first smart device at the occupancy time;
 causing the second simulation content to be presented by the second smart device at a delayed occupancy time, wherein the delayed occupancy time is based on a distance between the first location and the second location and a pre-defined simulated rate of movement of the object; and
 coordinating scheduling of presentation of the first and the second simulation contents based upon an average weight of the object being simulated.

14. The method of claim 13, comprising:
receiving the first and second simulation contents from a content library; and
providing the received first simulation content to the first smart device and the received second simulation content to the second smart device for presentation by the first and the second smart devices, respectively; or
receiving a first indication of the first simulation content and a second indication of the second simulation content from the content library; and
providing the first and the second indications to the first and the second smart devices, respectively, for presentation by the first and second smart devices.

15. The method of claim 13, comprising machine-readable instructions that, when executed by the one or more processors of the machine, cause the machine to:
cause the first and the second simulation contents to be presented by the first and the second smart devices, respectively, by causing a content library to send:
the first simulation content or a first indication of the first simulation content to the first smart device; and
the second simulation content or a second indication of the second simulation content to the second smart device.

16. The method of claim 13, wherein the first context comprises a distance or location relative to the second smart device.

17. The method of claim 13, comprising:
generating one or more transition simulations between the first simulation content and the second simulation content, by:
identifying a transition smart device spatially between the first smart device and the second smart device;
requesting transitional simulation content for the transition smart device; and
causing presentation of the one or more transition simulations prior to the second simulation content.

18. A system comprising one or more processors configured to:
identify a first context associated with a first smart device associated with a property and a second context associated with a second smart device associated with the property, the first context comprising a first location of the first smart device and the second context comprising a second location of the second smart device;
request first simulation content and second simulation content that simulate occupancy of an object at the first and the second locations, respectively;
identify an occupancy time comprising a time an activity that is represented by the first simulation content is performed by an occupant of the property;
coordinate scheduling of presentation of the first and the second simulation contents based upon the occupancy time; and
cause implementation of a simulation that simulates occupancy of the property in accordance with the scheduling, by:
 causing the first simulation content to be presented by the first smart device at the occupancy time;
 causing the second simulation content to be presented by the second smart device at a delayed occupancy time, wherein the delayed occupancy time is based on a distance between the first location and the second location and a pre-defined simulated rate of movement of the object; and
 coordinating scheduling of presentation of the first and the second simulation contents based upon an average weight of the object being simulated.

19. The machine-readable medium of claim 12, comprising machine-readable instructions that, when executed by the one or more processors of the machine, cause the machine to:
modify an intensity of presentation of the first simulation content, the second simulation content, or both to an intensity determined based on the average weight of the object being simulated.

* * * * *